United States Patent
Lee

(10) Patent No.: US 7,969,802 B2
(45) Date of Patent: *Jun. 28, 2011

(54) APPARATUS AND METHOD OF GENERATING OUTPUT ENABLE SIGNAL FOR SEMICONDUCTOR MEMORY APPARATUS

(75) Inventor: Hyun-Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 296 days.

This patent is subject to a terminal disclaimer.

(21) Appl. No.: 12/185,866

(22) Filed: Aug. 5, 2008

(65) Prior Publication Data

US 2008/0291759 A1 Nov. 27, 2008

Related U.S. Application Data

(63) Continuation of application No. 11/600,079, filed on Nov. 16, 2006, now Pat. No. 7,457,191.

(30) Foreign Application Priority Data

Dec. 28, 2005 (KR) .................. 10-2005-0131433

(51) Int. Cl.
*G11C 7/00* (2006.01)
(52) U.S. Cl. .................. 365/194; 365/233; 365/191
(58) Field of Classification Search .................. 365/233, 365/191, 185.18, 189.05, 194, 222, 189.15, 365/189.02

See application file for complete search history.

(56) References Cited

U.S. PATENT DOCUMENTS

| | | | |
|---|---|---|---|
| 6,388,945 B2 * | 5/2002 | Aikawa | ............... 365/233.11 |
| 6,621,315 B2 | 9/2003 | Heo et al. | |
| 6,686,777 B1 | 2/2004 | Karlquist | |
| 6,717,887 B1 * | 4/2004 | Kono et al. | ............... 365/189.14 |
| 6,980,479 B2 | 12/2005 | Park | |
| 6,982,924 B2 | 1/2006 | Na | |
| 6,987,705 B2 | 1/2006 | Kim et al. | |
| 7,088,159 B2 | 8/2006 | Kwak et al. | |
| 7,330,062 B2 | 2/2008 | Kobayashi et al. | |
| 2005/0105376 A1 | 5/2005 | Choi | |
| 2005/0242854 A1 * | 11/2005 | Kang et al. | ............... 327/158 |
| 2005/0248997 A1 | 11/2005 | Lee | |

FOREIGN PATENT DOCUMENTS

| | | |
|---|---|---|
| JP | 2005-116167 | 4/2005 |
| KR | 1020010026710 | 4/2001 |
| KR | 1020030002228 | 1/2003 |
| KR | 1020040072224 | 8/2004 |

* cited by examiner

*Primary Examiner* — Dang T Nguyen
(74) *Attorney, Agent, or Firm* — Venable LLP; Jeffri A. Kaminski

(57) ABSTRACT

A timing signal generator generates a timing signal when an external clock is synchronized with a predetermined internal timing. A frequency-divided clock generator divide a frequency of a DLL (Delay Locked Loop) clock so as to generate an even-numbered divided clock and an odd-numbered divided clock. An even-numbered output enable signal generator generates an even-numbered output enable signal on the basis of an external read command, the timing signal, a CL (CAS Latency), and the even-numbered divided clock. An odd-numbered output enable signal generator generates an odd-numbered output enable signal on the basis of the external read command, a timing signal in which the timing signal is inverted, the CL, and the odd-numbered divided clock. A logical unit logically operates the even-numbered output enable signal and the odd-numbered output enable signal and outputs an output enable signal.

16 Claims, 6 Drawing Sheets

APPARATUS AND METHOD OF GENERATING OUTPUT ENABLE SIGNAL FOR SEMICONDUCTOR MEMORY APPARATUS

This application is a continuation of U.S. patent application Ser. No. 11/600,079, filed Nov. 16, 2006, the subject matter of which application is incorporated herein by reference in its entirety.

BACKGROUND OF THE INVENTION

1. Technical Field

The present invention relates to semiconductor memory apparatus, and in particular, to an apparatus and method of generating an output enable signal for a semiconductor memory apparatus.

2. Related Art

As shown in FIG. 1, an apparatus for generating an output enable signal for a semiconductor memory apparatus according to the related art includes a plurality of output enable signal generators OE GEN CL03 to OE GEN CL10 that commonly receive an external read command RD_CMD and a DLL clock DLL_CLK, each delay the DLL clock DLL_CLK by a predetermined delay time, and each output an output enable signal in accordance with a CAS (Column Address Strobe) latency (Hereinafter, refer to as CL), and a multiplexer OE MUX that selects and outputs one output among the plurality of outputs of the output enable signal generators OE GEN CL03 to OE GEN CL10 in accordance with the CL.

The DLL clock is used to obtain a clock margin for outputting a data output enable signal in accordance with the external read command. Further, the DLL clock has a negative-delay component, that is, the DLL clock is counted before an external clock is counted.

As shown in FIG. 2, the output enable signal generator OE GEN CL10 among the plurality of output enable signal generators consists of a plurality of D flip-flops DFF and a delay chain having a plurality of delay elements DLY. Here, the output enable signal generator OE GEN CL9 has the same structure as the output enable signal generator OE GEN CL10 except that the number of D flip-flops and the number of delay elements are reduced by one, respectively. Similarly, the output enable signal generators OE GEN CL 8 to OE GEN CL 3 can be configured by removing the D flip-flops and the delay elements one-by-one from the same structure as the output enable signal generator OE GEN CL10.

As described above, in the technology according to the related art, the CL is adjusted by counting negative-delay components of an external clock and an internal DLL clock and continuously compensating the count value. A point in time when data is output, that is, a point in time when an output enable signal is generated, is controlled by recompensating the negative delay components of the DLL clock through the delay chain having a time difference on the basis of a current clock.

However, the apparatus for generating an output enable signal for a semiconductor memory apparatus according to the related art has a problem in that a high speed semiconductor memory apparatus is operated at a high frequency and this causes the CL to be increased. If the CL increases, the number of counts increases and the negative delay component increases. Accordingly, a time period for counting a point in time when outputting data decreases, causing the operational frequency to reach the limit.

SUMMARY

Embodiments of the present invention have been proposed to solve the above-described problem. Embodiments of the present invention provide an apparatus and method of generating an output enable signal for a semiconductor memory apparatus capable of generating a stable output enable signal by increasing a timing margin and a frequency margin.

According to an embodiment of the present invention, an apparatus for generating an output enable signal for a semiconductor memory apparatus includes a timing signal generator that generates a timing signal when an external clock is synchronized with a predetermined internal timing, a frequency-divided clock generator that divides a frequency of a DLL (Delay Locked Loop) clock so as to generate an even-numbered divided clock and an odd-numbered divided clock, an even-numbered output enable signal generator that generates an even-numbered output enable signal on the basis of an external read command, the timing signal, a CL (CAS Latency), and the even-numbered divided clock, an odd-numbered output enable signal generator that generates an odd-numbered output enable signal on the basis of the external read command, a timing signal to which the timing signal is inverted, the CL, and the odd-numbered divided clock, and a logical unit that logically operates the even-numbered output enable signal and the odd-numbered output enable signal and outputs an output enable signal.

According to another embodiment of the present invention, a method of generating an output enable signal for a semiconductor memory apparatus includes generating internally defined even-numbered divided clocks and odd-numbered divided clocks by using a DLL (Delay Locked Loop) clock, generating a timing signal when an external clock is synchronized with a predetermined internal timing, generating an even-numbered output enable signal by delaying the even-numbered divided clocks by a predetermined clock unit on the basis of the timing signal so as to match the CL information, generating an odd-numbered output enable signal by delaying the odd-numbered divided clocks by the predetermined clock unit on the basis of a timing signal to which the timing signal is inverted so as to match the CL information, and combining the even-numbered output enable signal and the odd-numbered output enable signal and generating a data output enable signal.

DESCRIPTION OF EXEMPLARY EMBODIMENTS

Preferred embodiments of the present invention will now be described with reference to the attached drawings.

Figure 1:
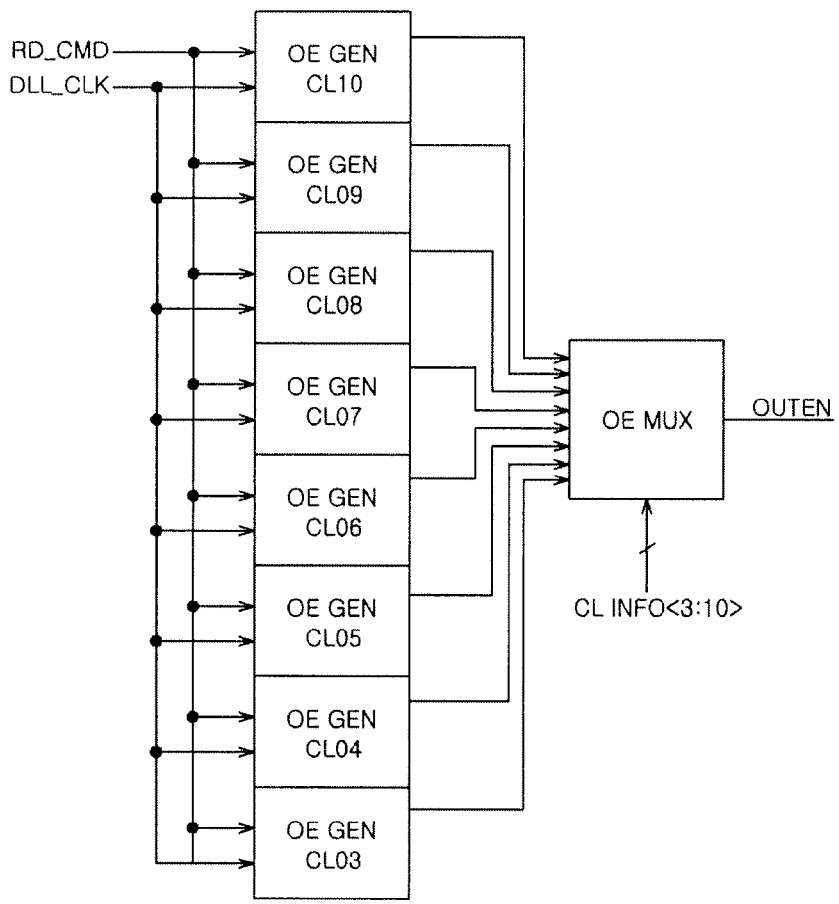
FIG. 1 is a block diagram illustrating the structure of an apparatus for generating an output enable signal of a semiconductor memory apparatus according to the related art.
Figure 2:
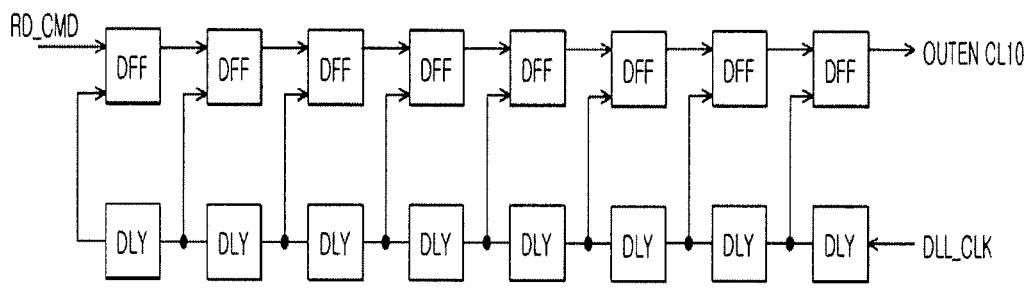
FIG. 2 is a circuit diagram illustrating the internal structure of an output enable signal generator shown in FIG. 1.
Figure 3:
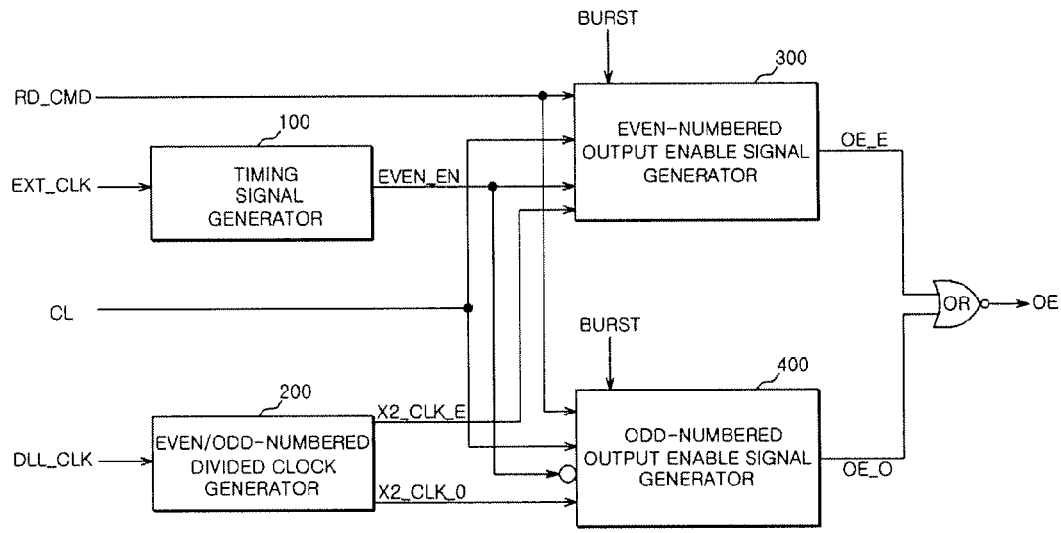
FIG. 3 is a block diagram illustrating the structure of an apparatus for generating an output enable signal for semiconductor memory apparatus according to an embodiment of the present invention.
Figure 4:
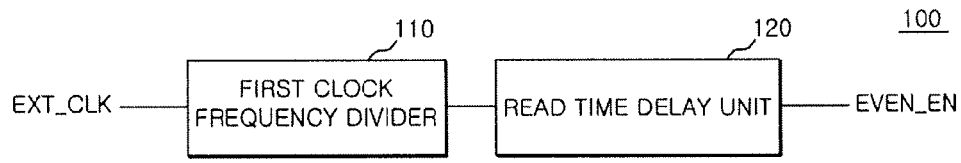
FIG. 4 is a block diagram illustrating the internal structure of a timing signal generator shown in FIG. 3.
Figure 5:
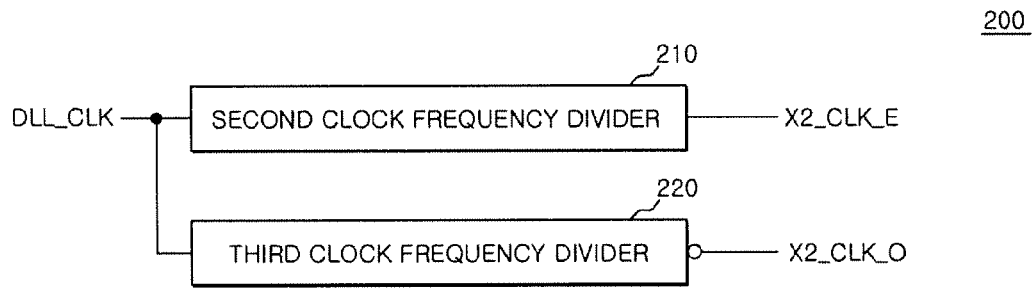
FIG. 5 is a circuit diagram illustrating the internal structure of a frequency-divided clock generator shown in FIG. 3.
Figure 6:
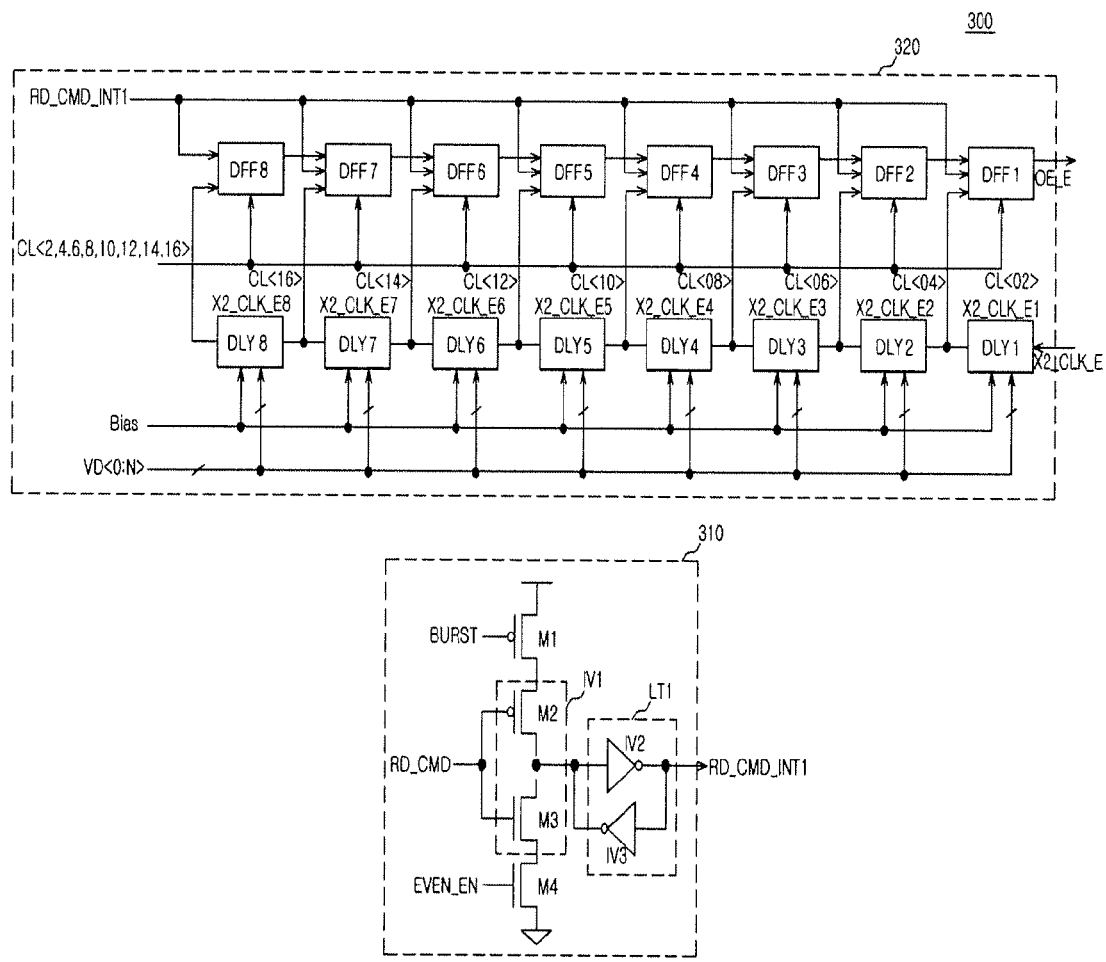
FIG. 6 is a circuit diagram illustrating the internal structure of an even-numbered output enable signal generator shown in FIG. 3.
Figure 7:
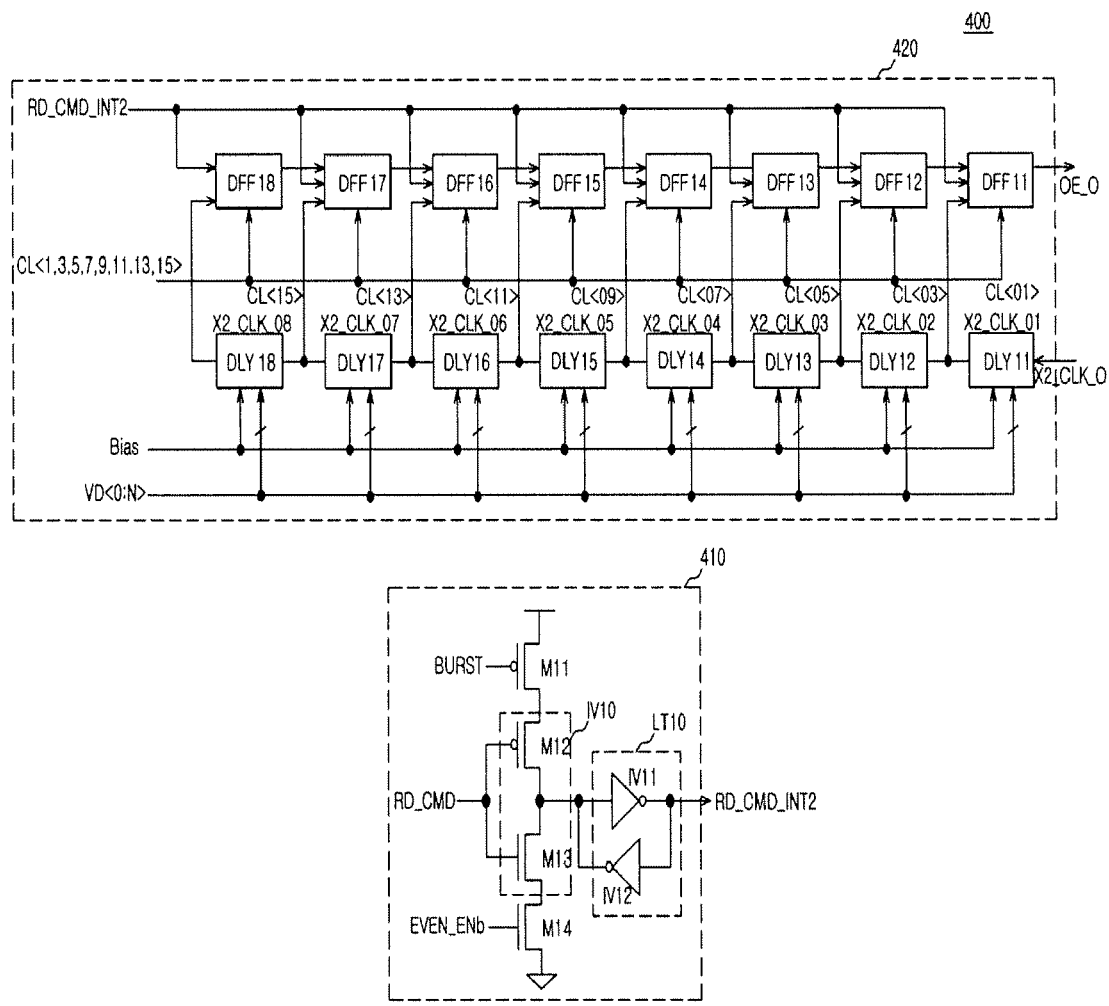
FIG. 7 is a circuit diagram illustrating the internal structure of an odd-numbered output enable signal generator shown in FIG. 3.
Figure 8:
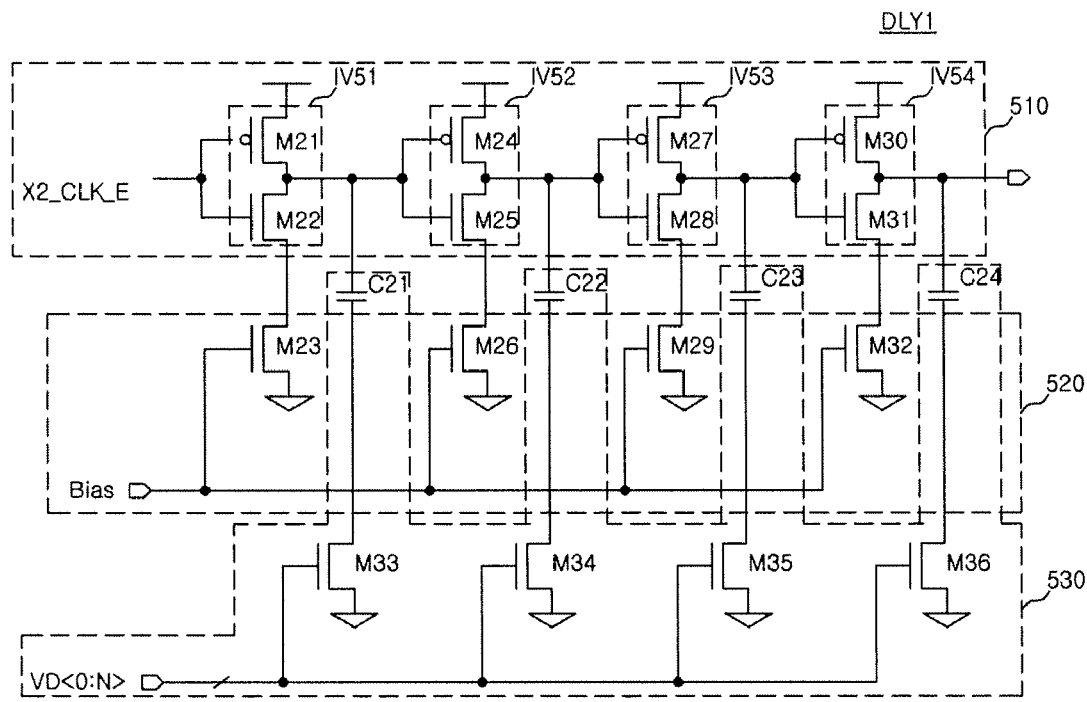
FIG. 8 is a circuit diagram illustrating the internal structure of a delay element DLY1 shown in FIG. 6.
Figure 9:
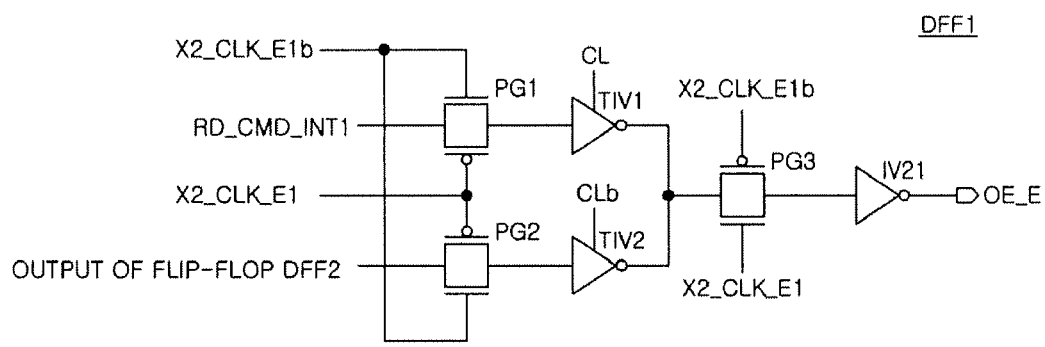
FIG. 9 is a circuit diagram illustrating the internal structure of a D flip-flop DFF1 shown in FIG. 6.
Figure 10:
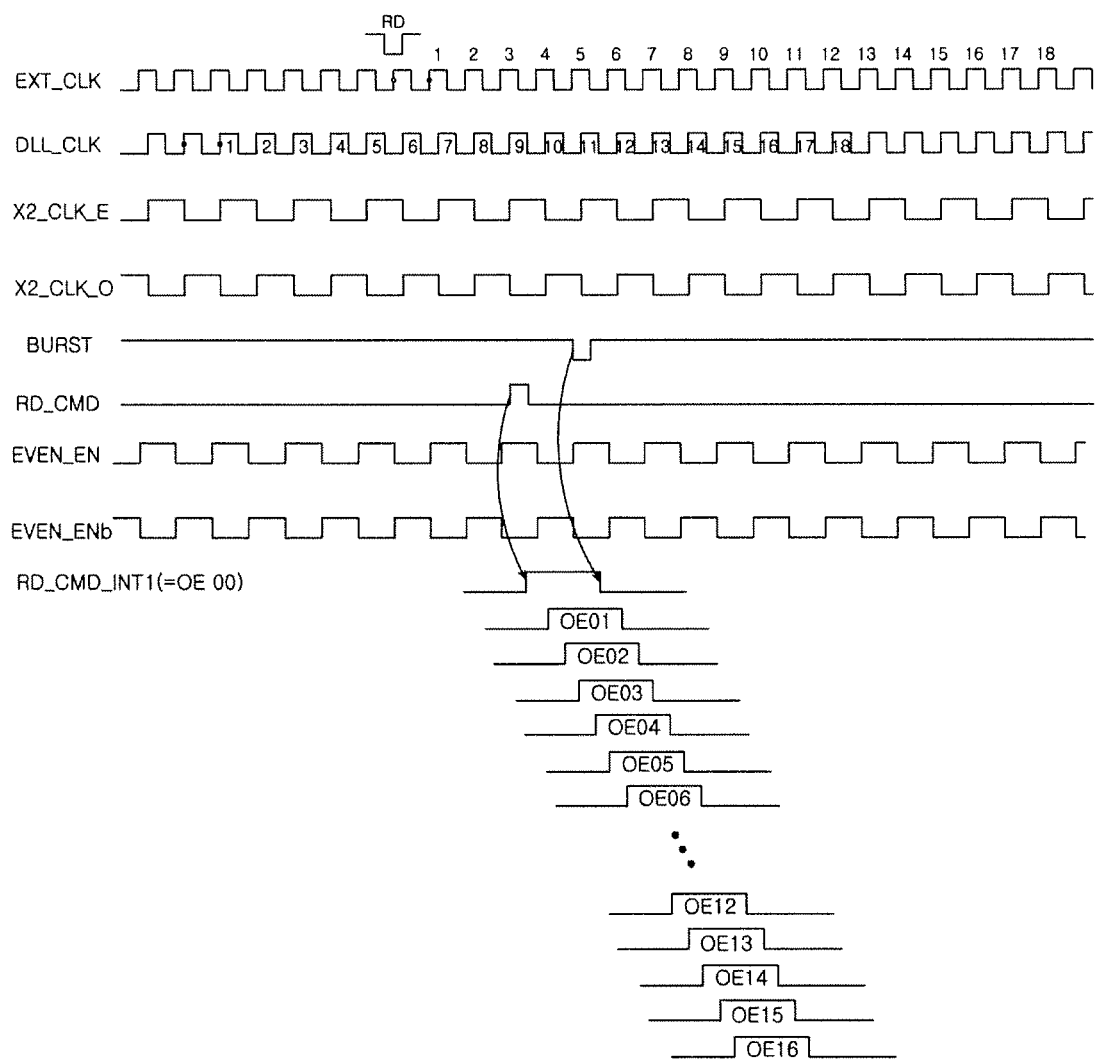
FIG. 10 is a timing diagram illustrating a signal waveform in each unit according to an embodiment of the invention.

FIG. 3 is a block diagram illustrating the structure of an apparatus for generating an output enable signal for a semiconductor memory apparatus according to an embodiment of the present invention. FIG. 4 is a block diagram illustrating the internal structure of a timing signal generator shown in FIG. 3. FIG. 5 is a block diagram illustrating the internal structure of a frequency-divided clock generator shown in FIG. 3. FIG. 6 is a circuit diagram illustrating the internal structure of an even-numbered output enable signal generator shown in FIG. 3. FIG. 7 is a circuit diagram illustrating the internal structure of an odd-numbered output enable signal generator shown in FIG. 3. FIG. 8 is a circuit diagram illustrating the internal structure of a delay element DLY1 shown in FIG. 6. FIG. 9 is a circuit diagram illustrating the internal structure of a D flip-flop DFF1 shown in FIG. 6. FIG. 10 is a timing diagram illustrating a signal waveform in each unit according to an embodiment of the present invention.

As shown FIG. 3, an apparatus for generating an output enable signal for a semiconductor memory apparatus according to the present invention includes a timing signal generator 100 that generates a timing signal where an external clock is synchronized with an internally set timing, a frequency-divided clock generator 200 that divides a frequency of a DLL (Delay Locked Loop) clock so as to generate an even-numbered divided clock and an odd-numbered divided clock, an even-numbered output enable signal generator 300 that generates an even-numbered output enable signal on the basis of an external read command, the timing signal, a CL (CAS Latency), and the even-numbered divided clock, an odd-numbered output enable signal generator 400 that generates an odd-numbered output enable signal on the basis of the external read command, a timing signal to which the timing signal is inverted, the CL, and the odd-numbered divided clock, and a logical element, that is, an OR gate, that logically operates on the even-numbered output enable signal and the odd-numbered output enable signal so as to output an output enable signal.

As shown in FIG. 4, the timing signal generator 100 includes a first clock frequency divider 110 that divides a frequency of an external clock EXT_CLK by 2, and a read time delay unit 120 that delays an output of the first clock frequency divider 110 by a data read time of the semiconductor memory apparatus, that is, a time period necessary to read data in response to a data read command of the semiconductor memory apparatus so as to generate a timing signal EVEN_EN.

As shown in FIG. 5, the frequency-divided clock generator 200 includes a second clock frequency divider 210 that divides a frequency of the DLL clock by 2 and outputs the divided clock as an even-numbered divided clock X2_CLK_E, and a third clock frequency divider 220 that divides the frequency of the DLL clock by 2, inverts the divided clock, and outputs the inverted clock as an odd-numbered divided clock X2_CLK_O.

As shown in FIG. 6, the even-numbered output enable signal generator 300 includes a first internal read command generator 310 that receives an external read command RD_CMD and generates a first internal read command RD_CMD_INT1 which matches an internal operation timing, and a first enable signal generator 320 that generates an even-numbered output enable signal OE_E by delaying the even-numbered divided clock X2_CLK_E on the basis of the first internal read command RD_CMD_INT1 and the CL information. The first internal read command generator 310 includes a first transistor M1 connected to a power supply terminal, an inverter IV1 composed of a second transistor M2 and third transistor M3 connected to the first transistor M1, a fourth transistor M4 connected between the inverter IV1 and a ground terminal, and a latch LT1 that is connected to an output terminal of the inverter IV1 and latches the first internal read command RD_CMD_INT1. Further, the first transistor M1 has a gate to which a burst signal BURST is input. The inverter IV1 has an input terminal, that is, the gates of the second and third transistors M2 and M3, to which the external read command RD_CMD is input. In addition, the fourth transistor M4 has a gate to which the timing signal EVEN_EN is input.

The first enable signal generator 320 includes a plurality of delay elements DLY1 to DLY8 that sequentially delay the even-numbered divided clock X2_CLK_E by a predetermined delay time and output the delayed even-numbered divided clocks X2_CLK_E1~X2_CLK_E8, and a plurality of flip-flops DFF1 to DFF8 that output the even-numbered output enable signal OE_E on the basis of the delayed even numbered divided clocks X2_CLK_E1~X2_CLK_E8, the first internal read command RD_CMD_INT1, and the first CL information CL <2, 4, 6, 8, 10, 12, 14, and 16>.

As shown in FIG. 7, the odd-numbered output enable signal generator 400 includes a second internal read command generator 410 that receives an external read command RD_CMD and generates a second internal read command RD_CMD_INT2 matching an internal operational timing, and a second enable signal generator 420 that generates an odd-numbered output enable signal OE_O by delaying the odd-numbered divided clock X2_CLK_O on the basis of the second internal read command RD_CMD_INT2 and the CL information.

The second internal read command generator 410 includes a first transistor M11 connected to the power supply terminal, an inverter IV10 composed of a second transistor M12 and a third transistor M13 connected to the first transistor M11, a fourth transistor M14 connected between the inverter IV10 and the ground terminal, and a latch LT10 unit that is connected to an output terminal of the inverter IV10 and latches the second internal read command RD_CMD$_{13}$INT2. Further, the first transistor M11 has a gate to which a burst signal BURST is input. The inverter IV10 has an input terminal, that is, the gates of the second and third transistors M12 and M13, to which the external read command RD_CMD is input. In addition, the fourth transistor M14 has a gate to which a timing signal EVEN_ENb is input. The timing signal EVEN_ENb is a signal to which the timing signal EVEN_EN is inverted.

The second enable signal generator 420 includes a plurality of delay elements DLY11 to DLY18 that sequentially delay the odd-numbered divided clock X2_CLK_O by a predetermined delay time and output the delayed odd-numbered divided clock X2_CLK_O, and a plurality of flip-flops DFF11 to DFF18 that output an odd-numbered output enable signal OE_O on the basis of outputs of the plurality of delay elements DLY11 to DLY18, the second internal read command RD_CMD_INT2, and the second CL<1, 3, 5, 7, 9, 11, 13, and 15>.

At this time, the plurality of delay elements DLY1 to DLY8 and DLY11 to DLY18 have the same structure. Hereinafter, one delay element DLY1 will be described. As shown in FIG. 8, the delay element DLY1 includes an inverter chain 510 composed of a plurality of inverters IV51~IV54, a delay time setting unit 520 setting a delay time of each of the inverters IV51~IV54 in accordance with an applied bias voltage Bias, and a delay time varying unit 530 varying a delay time of each of the inverters IV51~IV54 on the basis of a delay time varying signal VD<0:N>. Each of the inverters IV51~IV54 is composed of transistors M21 and M22, transistors M24 and M25, transistors M27 and M28, and transistors M30 and M31. The delay time setting unit 520 is composed of transistors M23, M26, M29, and M32. The delay time varying unit 530 is composed of capacitors C21, C22, C23, and C24 and transistors M33, M34, M35, and M36.

Further, the plurality of flip-flops DFF1 to DFF8 and DFF11 to DFF18 have the same structure. Hereinafter, one flip-flop DFF1 will be described. As shown in FIG. 9, the flip-flop DFF1 includes a first transfer element PG1, a second transfer element PG2 that receives an output of a previous flip-flop DFF2, a third transfer element TIV1 that receives an output of the first transfer element PG1, a fourth transfer element TIV2 that receives an output of the second transfer element PG2, a fifth transfer element PG3 that receives the outputs of the third and fourth transfer elements TIV1 and TIV2, and an inverter IV21. At this time, the first, second, and fifth transfer elements PG1, PG2, and PG3 are pass gates and are turned on or turned off on the basis of the even-numbered divided clock X2_CLK_E1 output from the previous delay element DLY1 and an even-numbered divided clock X2_CLK_E1b, to which the even-numbered divided clock X2_CLK_E1 is inverted. In addition, the third and fourth transfer elements TIV1 and TIV2 are tri-state inverters and are turned on or turned off on the basis of one of the input CL information CL<2>, input to the corresponding transfer element, among the CL information CL<2, 4, 6, 8, 10, 12, 14, and 16> and CL information CLb to which the CL information CL<2> is inverted.

The operation of the apparatus for generating a data output enable signal for a semiconductor memory apparatus having the above-described structure according to an embodiment of the present invention will be described with reference to FIGS. 3 to 10.

As shown in FIG. 10, the frequency-divided clock generator 200 shown in FIG. 3 divides the DLL clock DLL_CLK by 2 so as to generate an even-numbered divided clock X2_CLK_E and inverts the generated even-numbered divided clock X2_CLK_E so as to generate an odd-numbered divided clock X2_CLK_O.

As shown in FIG. 10, the timing signal generator 100 shown in FIG. 3 divides the external clock EXT_CLK by 2 and delays the divided external clock by a time period corresponding to a data read time of the semiconductor memory apparatus so as to generate a timing signal EVEN_EN.

The even-numbered output enable signal generator 300 shown in FIG. 3 generates the even-numbered output enable signal OE_E on the basis of the external read command RD_CMD, the timing signal EVEN_EN, the CL, and the even-numbered divided clock X2_CLK_E. The operation of the even-numbered output enable signal generator 300 will be described below in detail.

First, the first internal read command generator 310 shown in FIG. 6 receives an external read command RD_CMD and generates a first internal read command RD_CMD_INT1. The first internal read command RD_CMD_INT1 is enabled at a time when the timing signal EVEN_EN shown in FIG. 10 is enabled, that is, at a rising edge of the timing signal EVEN_EN, and is disabled at a time when the burst signal BURST is enabled, that is, at a falling edge of the burst signal BURST. At this time, the first internal read command RD_CMD_INT1 is identical with an output enable signal OE00 that is a reference of the output enable signal OE.

In the first enable signal generator 320 shown in FIG. 6, the plurality of delay elements DLY1 to DLY8 outputs even-numbered divided clocks X2_CLK_E1 to X2_CLK_E8 delayed by the inverter chain 510 by a time period in accordance with the bias voltage applied to the delay time setting unit 520. The delay time varying signal VD<0:N> causes the delay time set by the delay time setting unit 520 to increase or decrease.

That is, if half of the overall bits of the delay time varying signal VD<0:N> is set to be enabled at the initial operation, it is possible to decrease the number of bits to be enabled such that the delay time is reduced or it is possible to increase the number of bits to be enabled such that the delay time is increased according to the necessity.

Further, when a clock among the delayed even-numbered divided clocks X2_CLK_E1 to X2_CLK_E8 is input to one of the flip-flops DFF1 to DFF8 and the corresponding clock is at a low level, each of the flip-flops DFF1 to DFF8 receives the first internal read command RD_CMD_INT1 and the output of the previous flip-flop. Meanwhile, when the corresponding input clock is at a high level, each of the flip-flops DFF1 to DFF8 outputs the internal read command RD_CMD_INT1 or the output of the previous flip-flop on the basis of the CL information. For example, in the case of CL<02> (CL2 is at a high level, CL4 to CL16 are at a low level), when the clock X2_CLK_E1 output from the delay element DLY1 is at a low level, the flip-flop DFF1 receives the first internal read command RD_CMD_INT1 and the output of the flip-flop DFF2. Meanwhile, when the clock X2_CLK_E1 is at a high level, the flip-flop DFF1 outputs the first internal read command RD_CMD_INT1 as the even-numbered output enable signal OE_E. For another example, in the case of CL<16>, when the clock X2_CLK_E8 output from the delay element DLY8 is at a low level, the flip-flop DFF8 receives the first internal read command RD_CMD_INT1 and when the clock X2_CLK_E8 is at a high level, the flip-flop DFF8 outputs the first internal read command RD_CMD_INT1. The other flip-flops DFF7 to DFF1 sequentially transfer the output of the flip-flop DFF8 and finally output the even-numbered output enable signal OE_E on the basis of the clocks X2_CLK_E7 to X2_CLK_E1.

On the other hand, the odd-numbered output enable signal generator 400 shown in FIG. 3 generates an odd-numbered output enable signal OE_O on the basis of the external read command RD_CMD, the inverted timing signal EVEN_EN, the CL, and the odd-numbered divided clock X2_CLK_O. Since the detailed operational principal of the odd-numbered output enable signal generator 400 is the same as the even-numbered output enable signal generator 300 while the input timings of the signals are different from each other, the operation of the odd-numbered output enable signal generator 400 will be omitted.

As described above, on the basis of the CL information, the even-numbered output enable signal generator 300 outputs the even-numbered output enable signal OE_E or the odd-numbered output enable signal generator 400 outputs the odd-numbered output enable signal. That is, in the case that the CL corresponds to the even number, the even-numbered output enable signal generator 300 generates the even-numbered output enable signal OE_E. On the other hand, in the case that the CL corresponds to the odd number, the odd-numbered output enable signal generator 400 generates the odd-numbered output enable signal.

Therefore, as shown in FIG. 10, output enable signals OE01 to OE16 are finally output through the OR gate shown in FIG. 3.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

The apparatus and method of generating an output enable signal for a semiconductor memory apparatus according to an embodiment of the present invention can generate a stable output enable signal by increasing the timing margin and the frequency margin. Therefore, it is possible to increase the reliability of the semiconductor memory apparatus and to apply the apparatus and method of generating an output enable signal for semiconductor memory apparatus to various systems regardless of the operational frequency.

What is claimed is:

1. An apparatus of generating an output enable signal for semiconductor memory apparatus, comprising:
    a frequency-divided clock generator configured to divide a frequency of a DLL (Delay Locked Loop) clock so as to generate a divided clock; and
    an output enable signal generator configured to generate an output enable signal in response to an external read command, a CL (CAS Latency), and the divided clock.

2. The apparatus of claim 1, further comprising:
    a timing signal generator configured to generate a timing signal for setting a generation timing of the output enable signal using an external clock.

3. The apparatus of claim 2,
    wherein the timing signal generator is configured to generate the timing signal by dividing the external clock and delaying the divided external clock by a predetermined time.

4. The apparatus of claim 3,
    wherein the predetermined time is equal to a time necessary to read data in accordance with a data read command of the semiconductor memory apparatus.

5. The apparatus of claim 1,
    wherein the output enable signal generator includes:
    an internal read command generator configured to receive the external read command and generate an internal read command matching an internal operation timing; and
    an enable signal generator configured to generate the output enable signal by delaying the divided clock on the basis of the internal read command and the CL.

6. The apparatus of claim 5,
    wherein the internal read command generator configured to activate the internal read command by latching the external clock by a activation period of the timing signal, and inactivate the internal read command in response to an activation of a burst signal.

7. The apparatus of claim 5,
    wherein the enable signal generator includes:
    a plurality of delay elements configured to sequentially delay the divided clock by a predetermined delay time and output the delayed divided clocks, and
    a plurality of flip-flops configured to output the output enable signal on the basis of the outputs of the plurality of delay elements, the internal read command, and the CL information.

8. The apparatus of claim 7,
    wherein the delay element includes:
    an inverter chain composed of a plurality of inverters; and
    a delay time setting unit configured to set a delay time of each inverter in accordance with an applied bias voltage.

9. The apparatus of claim 8,
    wherein the delay time setting unit includes a plurality of transistors connected between each of the inverters and the ground terminal and each having a gate configured to receive a bias voltage.

10. The apparatus of claim 8,
    wherein the delay element further comprises a delay time varying unit configured to vary the delay time of each of the inverters.

11. The apparatus of claim 10,
    wherein the delay time varying unit includes a plurality of capacitors and a plurality of transistors connected between the output nodes of the inverters and the ground terminal and the plurality of transistors each including a gate configured to receive a signal for varying the delay time.

12. The apparatus of claim 11,
    wherein the signal for varying the delay time is a signal of a plurality of bits for selectively turning on the plurality of transistors.

13. A method of generating an output enable signal for semiconductor memory apparatus, comprising:
    generating a divided clock by using a DLL (Delay Locked Loop) clock;
    generating a timing signal when an external clock is synchronized with a predetermined internal timing; and
    generating an output enable signal by delaying the divided clock in a predetermined clock unit so as to match CL information on the basis of the timing signal.

14. The method of claim 13,
    wherein the generating of the timing signal includes:
    dividing a frequency of the external clock; and
    delaying the frequency-divided clock by a predetermined time and outputting the delayed clock as the timing signal.

15. The method of claim 13,
    wherein the generating of the output enable signal includes:
    generating an internal read command that matches an internal signal process timing by receiving an external read command on the basis of the timing signal; and
    generating the output enable signal by delaying the divided clock so as to match the CL information on the basis of the internal read command.

16. The method of claim 15,
    wherein the internal read command is activated according to the external read command by a activation period of the timing signal, and is inactivated in response to an activation of a burst signal.

* * * * *